(12) United States Patent
Bruwer et al.

(10) Patent No.: US 8,395,395 B2
(45) Date of Patent: Mar. 12, 2013

(54) NOISE REJECTION AND PARASITIC CAPACITANCE REMOVAL IMPLEMENTATIONS

(75) Inventors: Frederick Johannes Bruwer, Paarl (ZA); Jean Viljoen, Paarl (ZA); Grant Cecil Harker, Paarl (ZA); Douw Gerbrandt Van Der Merwe, Paarl (ZA)

(73) Assignee: Azoteq (Pty) Ltd., Paarl (ZA)

( * ) Notice: Subject to any disclaimer, the term of this patent is extended or adjusted under 35 U.S.C. 154(b) by 494 days.

(21) Appl. No.: 12/593,956

(22) PCT Filed: Nov. 27, 2008

(86) PCT No.: PCT/ZA2008/000116
§ 371 (c)(1),
(2), (4) Date: Sep. 30, 2009

(87) PCT Pub. No.: WO2009/070814
PCT Pub. Date: Jun. 4, 2009

(65) Prior Publication Data
US 2010/0060301 A1 Mar. 11, 2010

(30) Foreign Application Priority Data

Nov. 27, 2007 (ZA) ................................. 2007/10292
Mar. 14, 2008 (ZA) ................................. 2008/02425
Apr. 22, 2008 (ZA) ................................. 2008/03595

(51) Int. Cl.
*G01R 27/26* (2006.01)
(52) U.S. Cl. ..... 324/686; 324/679; 713/100; 178/18.06; 345/173

(58) Field of Classification Search ................... 324/686
See application file for complete search history.

(56) References Cited

U.S. PATENT DOCUMENTS

| | | | | |
|---|---|---|---|---|
| 3,786,497 A | * | 1/1974 | Davis et al. | 341/24 |
| 3,919,596 A | | 11/1975 | Bellis | |
| 4,336,557 A | * | 6/1982 | Koch | 348/302 |
| 4,860,232 A | * | 8/1989 | Lee et al. | 702/104 |
| 5,053,757 A | | 10/1991 | Meadows | |
| 5,118,966 A | * | 6/1992 | Kumada | 327/100 |
| 5,194,819 A | * | 3/1993 | Briefer | 324/684 |
| 5,451,940 A | * | 9/1995 | Schneider et al. | 340/870.37 |
| 5,730,165 A | * | 3/1998 | Philipp | 137/1 |
| 5,784,241 A | * | 7/1998 | Munch et al. | 361/111 |
| 6,194,903 B1 | | 2/2001 | Schulz | |
| 6,225,710 B1 | | 5/2001 | Palata et al. | |
| 6,466,036 B1 | * | 10/2002 | Philipp | 324/678 |
| 6,486,680 B1 | * | 11/2002 | Mull | 324/662 |
| 6,504,530 B1 | | 1/2003 | Wilson et al. | |
| 7,031,886 B1 | * | 4/2006 | Hargreaves | 702/191 |
| 7,084,860 B1 | | 8/2006 | Jaeger et al. | |
| 7,129,712 B1 | | 10/2006 | Drost et al. | |
| 7,504,833 B1 | | 3/2009 | Seguine | |
| 7,567,240 B2 | | 7/2009 | Peterson et al. | |
| 7,746,325 B2 | | 6/2010 | Roberts | |
| 7,876,311 B2 | | 1/2011 | Krah et al. | |
| 7,952,366 B2 | | 5/2011 | Philipp et al. | |
| 8,026,904 B2 | | 9/2011 | Westerman | |
| 8,058,937 B2 | | 11/2011 | Qin et al. | |
| 8,059,015 B2 | | 11/2011 | Hua et al. | |

(Continued)

*Primary Examiner* — Melissa Koval
*Assistant Examiner* — Benjamin M Baldridge
(74) *Attorney, Agent, or Firm* — William A Blake

(57) ABSTRACT

A capacitive sensing circuit including a microchip and a sense plate, wherein the microchip comprises a hardware Q RF noise detector module that provides a logical indication of when noise impacts on the integrated circuit.

18 Claims, 6 Drawing Sheets

U.S. PATENT DOCUMENTS

| | | |
|---|---|---|
| 8,089,288 B1 | 1/2012 | Maharita |
| 8,144,126 B2 | 3/2012 | Wright |
| 2002/0050983 A1 | 5/2002 | Liu et al. |
| 2003/0067451 A1 | 4/2003 | Tagg et al. |
| 2004/0019810 A1* | 1/2004 | Casebolt et al. ............ 713/300 |
| 2005/0099188 A1* | 5/2005 | Baxter ........................ 324/678 |
| 2005/0240785 A1* | 10/2005 | Casebolt et al. ............ 713/300 |
| 2006/0007171 A1 | 1/2006 | Burdi et al. |
| 2006/0125544 A1* | 6/2006 | Brady et al. ................ 327/336 |
| 2006/0138574 A1* | 6/2006 | Saito et al. .................. 257/417 |
| 2006/0232567 A1* | 10/2006 | Westerman et al. ......... 345/173 |
| 2006/0290677 A1 | 12/2006 | Lyon et al. |
| 2007/0137315 A1* | 6/2007 | Harazin et al. ............ 73/863.02 |
| 2007/0152682 A1* | 7/2007 | Ungaretti et al. ........... 324/678 |
| 2007/0257890 A1 | 11/2007 | Hotelling et al. |
| 2008/0122454 A1* | 5/2008 | Kato ........................... 324/661 |
| 2008/0128182 A1* | 6/2008 | Westerman et al. ....... 178/18.06 |
| 2008/0136792 A1* | 6/2008 | Peng et al. .................. 345/174 |
| 2008/0158178 A1* | 7/2008 | Hotelling et al. ........... 345/173 |
| 2008/0162996 A1 | 7/2008 | Krah et al. |
| 2008/0191713 A1* | 8/2008 | Hauer et al. ................ 324/658 |
| 2009/0002206 A1 | 1/2009 | Kremin |
| 2009/0008161 A1* | 1/2009 | Jones et al. ............... 178/18.06 |
| 2010/0201382 A1* | 8/2010 | Welland ...................... 324/686 |

* cited by examiner

NOISE REJECTION AND PARASITIC CAPACITANCE REMOVAL IMPLEMENTATIONS

BACKGROUND OF THE INVENTION

This invention relates to the rejection or detection of noise in a capacitive sensing circuit and reduction of sense plate capacitance or parasitic capacitance.

A capacitive sensing circuit used to detect touch or proximity events is easily adversely affected by noise. This problem is normally addressed by trying to adjust a de-bouncing circuit and filtering and voltage trip levels.

Appliances such as electric drills and mobile phones generate noise which is difficult to combat. The effect of noise on apparatus such as an oven, a cooking plate, a chain saw or the like, which is designed to be controlled by the use of capacitive sensing switches, responsive to touch or proximity, is unacceptable. The false detection of a touch or proximity event could have serious adverse consequences and this, in itself, limits or prevents the adoption of capacitive sensing arrangements in many applications.

Most people are aware from personal experience when talking on a landline phone that immediately before a signal comes from a mobile phone, specifically GSM, or prior to receiving a call, higher than normal energy fields are radiated by the phone which interfere with the signal on the landline phone. This leads to the conclusion that a product which may work satisfactorily under certain conditions can be adversely affected at other times.

SUMMARY OF INVENTION

The invention is based on using the radiation from an external noise source and its coupling with a sense plate of a capacitive sensor, electrical circuit or power supply to determine whether an acceptable signal to noise ratio (SNR) is present. Otherwise put, a noise signal which can cause false detection by a capacitive sensing arrangement is used to determine whether the SNR is acceptable.

According to one aspect of the invention there is provided a method of obtaining a measure of a noise level in a capacitive sensing circuit which includes a sense plate and a reference capacitor which includes the steps of:
a) charging the sense plate to a known voltage;
b) discharging the sense plate into the reference capacitor;
c) repeating steps (a) and (b) until the voltage of the reference capacitor reaches a predetermined value; and
d) using the number of times that steps (a) and (b) were repeated as a measure of the capacitance coupled with the sense plate and the capacitance of the sense plate itself in the circuit.

With the reference capacitor at a specific voltage level, sensors check the voltage level on the reference capacitor for any variation that is outside predetermined levels.

Unacceptable variations can then be used to signal that noise coupling with the sensing circuit is too high.

During such a period a choice can be made with regards to the handling of this knowledge. For example, only touch indication may be prohibited, or a warning may be given such that a processor receiving information from the sensor can decide how to react.

According to a different aspect of the invention there is provided apparatus for obtaining a measure of a noise level in a capacitive sensing circuit which includes a sense plate and a reference capacitor, the apparatus including a first switch which is operable to connect the sense plate to a voltage source which charges the sense plate to a reference voltage, a second switch which is operable for transferring charge from the sense plate to the reference capacitor, and a module to monitor the voltage on the reference capacitor and to generate an output signal when the voltage on the reference capacitor reaches a trip level.

The apparatus may include a third switch and the second and third switches may be operable, upon closure, to discharge the sense plate and the reference capacitor to ground. In an embodiment, the charging and discharging of the sense plate and the operation with regards to the reference capacitor can be halted.

The voltage levels on either the sense plate or reference capacitor can then be monitored for variations outside predetermined limits and unacceptable variations can be interpreted as indicating a noise presence which is too high or which has an undesirable influence on the sensing circuit.

The noise may couple through a multitude of ways with the sensing apparatus, for example, but not limited to: the power supply; the sense plate; a printed circuit board or any specific track or component.

It may be possible to reduce the noise coupling with the circuit through filtering but in some embodiments it may be practical merely to detect noise and to use this knowledge in the interpretation of signals detected by the sensor: for example a prohibition on a change in status may apply during a noise condition.

In another embodiment an RF detector circuit may be employed to monitor noise coupling with the sensing circuit. This technique allows for continuous monitoring whereas the plate and reference capacitor monitoring technique can only be used during non-capacitive sensing periods. It is also possible accurately to identify an individual sample affected by noise and then to ignore or remove only that specific sample.

The invention also extends to a capacitive sensing circuit including a microchip and a sense plate, wherein the microchip comprises a hardware RF noise detector module that provides a logical indication of when noise impacts on the integrated circuit.

In a variation the capacitive sensing circuit includes a microchip and a sense plate, wherein the microchip comprises an extra sense channel that is configured not to be influenced by user interface actions but rather to detect the presence of noise in the environment, and wherein the presence of noise detected can be used to ignore specific data values or to use these values in a different than normal way.

The invention also provides a capacitive sensing circuit which reduces the effective capacitance of a sense plate by removing a value charge from a reference capacitor, during each charge transfer cycle, when charge is transferred to the reference capacitor from the sense plate.

Another benefit is that some noise may influence the RF-detector but not the reference or plate capacitance. This may result in a noise alarm without the measurements being significantly affected by the noise.

BRIEF DESCRIPTION OF THE DRAWINGS

The invention is further described by way of examples with reference to the accompanying drawings in which.

DESCRIPTION OF PREFERRED EMBODIMENTS

In a capacitive sensing circuit a sense plate or element, designated in this specification by the reference Cx, is charged to a working voltage. A touch or proximity event is reflected by a change in capacitive coupling to the sense plate and a resulting change (delta) in the charge on the sense plate that can be detected when the sense plate is discharged into a reference capacitor.

In general terms use is made of a charge transfer principle to measure the capacitive coupling of the sense plate to the environment. When an object approaches the sense plate the capacitive coupling to the environment changes, typically increasing the capacitance of the plate, and this change is detected by the circuit which then interprets the change as a proximity or touch event.

Figure 1:
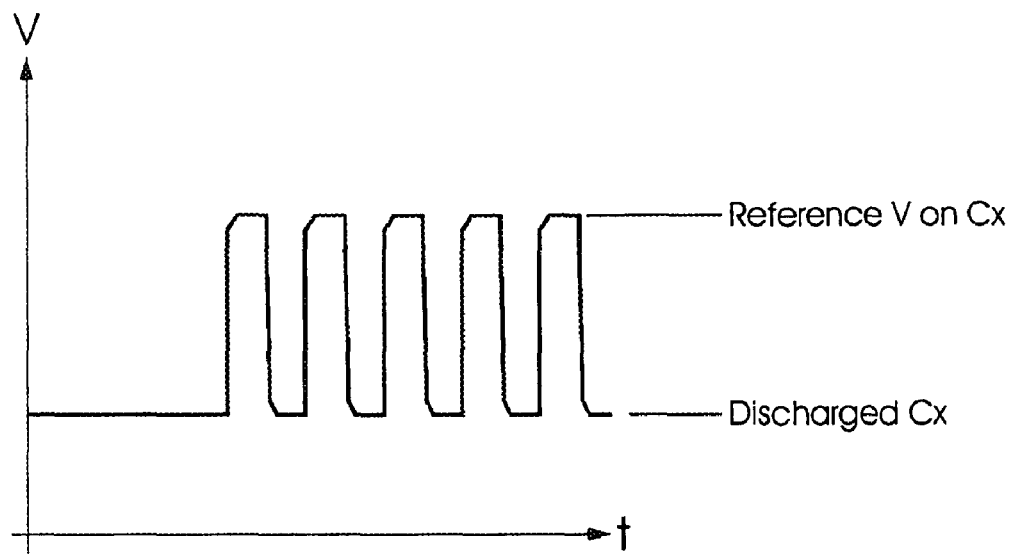
FIG. 1 shows first cycles of a voltage waveform during initial stages of a charge transfer cycle in an implementation of the method of the invention.

FIG. 1 of the accompanying drawings illustrates initial waveforms on a sense plate Cx as the sense plate is charged from a discharged state to a voltage level which is stable over time, particularly on a short term basis. The sense plate is then discharged into a reference capacitor (designated by the reference numeral Cs herein) that was completely discharged before the cycle started. The charging and discharging of the sense plate Cx is repeated until the voltage on the reference capacitor Cs reaches a predefined and very stable trip level. The number of charge transfers required to reach the trip level is then used as a measure of the capacitive value of the sense plate Cx. The period from the beginning of the charging process to the trip level, T in FIG. 2, is referred to as a charge transfer cycle.

Figure 2:
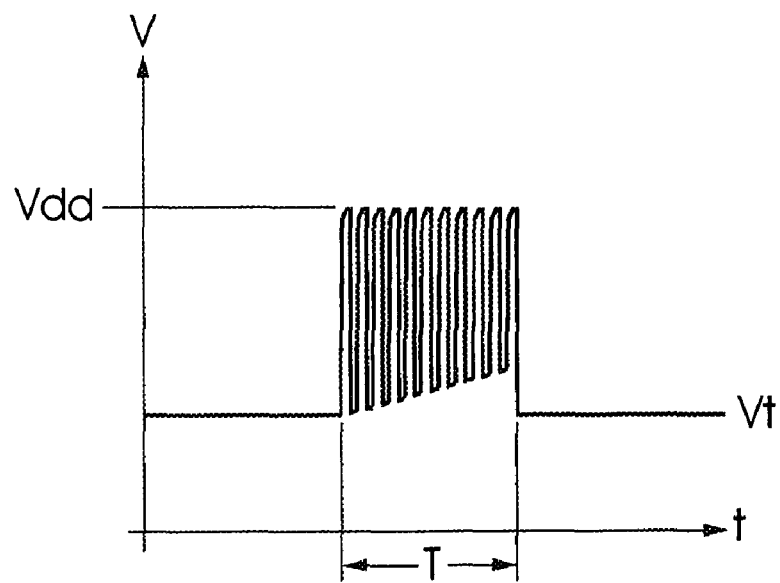
FIG. 2 shows the voltage waveform on the sense plate over a complete charge transfer cycle.

FIG. 2 shows the voltage waveform on the sense plate Cx over a complete charge transfer cycle. The time scale in FIG. 2 is compressed compared to the time scale in FIG. 1.

The upper end of the wave form illustrated in FIG. 2 shows that the sense plate Cx is charged each time, during the charge transfer cycle, to the same voltage level $V_{dd}$. When the sense plate is discharged the reference capacitor receives the charge. The voltage on the reference capacitor gradually increases—this is matched by the limiting voltage shown at the bottom of the waveform which indicates that the sense plate Cx only discharges to the voltage level on the reference capacitor. The Cs voltage is sensed by the trip sensor.

When the voltage on the reference capacitor reaches the trip level Vt, which is the voltage at the lower end and last part of the waveform shown in FIG. 2, a count of the number of charge transfers is recorded and the sense plate and the reference capacitor are discharged through a connection to ground. The aforementioned process is repeated as required. The measure of the capacitance of the sense plate (including its coupling to the environment) is thus derived from the number of charge transfers during each charge transfer cycle T.

Figure 3:
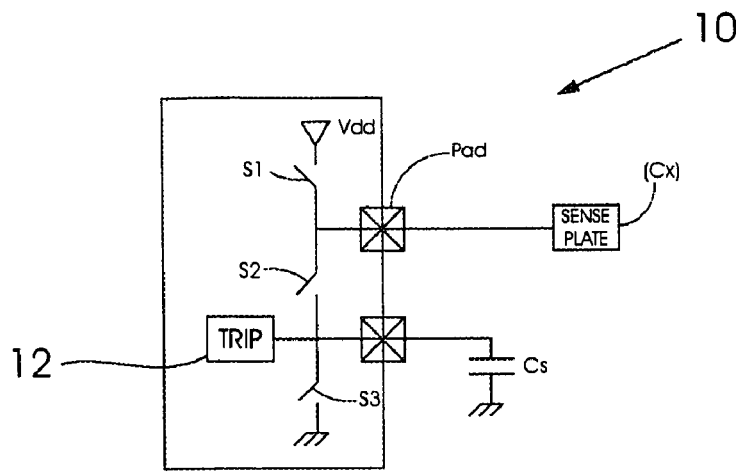
FIG. 3 illustrates a circuit, according to the invention, used to perform a charge transfer operation.

FIG. 3 illustrates a circuit 10, which preferably is implemented as an integrated circuit (microchip), which carries out the charge transfer cycle. A switch S1 is closed to connect a sense plate Cx to a reference voltage $V_{dd}$. The sense plate is then charged to the reference voltage. Thereafter a switch S2 is closed to transfer the charge from the sense plate Cx to a reference capacitor Cs. The voltage on the reference capacitor is monitored by a trip module 12 and when the trip voltage Vt is reached the module is triggered. Closure of a third switch S3 simultaneously with the switch S2 causes the sense plate Cx and the reference capacitor Cs to be discharged to ground.

The voltage or charge level on the sense plate Cx is checked to determine if unacceptably strong noise is coupling into the capacitive sensing circuitry. This is done during any period when it is known that a particular voltage value should be on the sense plate Cx by comparing the particular value to the actual voltage on the sense plate. If the comparison gives rise to a difference which is greater than what is acceptable then this is judged as being attributable to the effect of noise. "Acceptable" in this respect is a design parameter which can differ for various applications and from circuit to circuit and which can be influenced by the fundamental accuracy and sensitivity of the specific circuit.

Generally the voltage on the sense plate Cx is checked because the sense plate has a high impedance and is a more sensitive element than, for example, the reference capacitor Cs. However the use of Cs in this respect can create a low path frequency filter effect which can form a signal envelope when dealing, for example, with RF signals from mobile phones and similar appliances. Cx is also exposed to normal (non-noise related) events that may affect the voltage on it, such as a touch. It is easier though to isolate Cs in order to try and limit changes in voltage to noise related events.

Any determination that the sense plate Cx or Cs is subjected to an unacceptable noise level can be used to influence operation of the capacitive sensing circuit. For example, a normal output can be generated to indicate the detection of a touch or proximity event, whilst a different output can be generated to indicate a problematic environmental impact (i.e. the presence of noise). Alternatively, an output could be inhibited or a de-bounce counter could be reset if the noise level is unacceptable. Another option is to prevent the most recent transfer count obtained during a charge transfer cycle from being fed into the system if the count is regarded as being inaccurate due to the noise presence. The debouncing may be cleared for either a rising or a falling edge. This means that it may be that when a "good" touch is detected, then noise is detected, that the "touch" event is maintained by the sense circuit through clearing the debounce register managing the determination of the falling edge.

During certain periods of the charge and discharge cycles the voltage on Cx has particular levels. One such level occurs when the sense plate is discharged into the reference capacitor. At this time when the voltage on the reference capacitor is compared with the trip voltage, after every discharge from the sense plate, the voltage level on the sense plate will also remain below the trip voltage, until the sense plate is recharged. Thus the voltage on the sense plate can conveniently be checked using the trip module 12, during this period, to determine if it is being charged by a noise source.

It may be necessary to allow for a time period during which the voltage on the sense plate can be affected and it may also be necessary to introduce a voltage drop over some element between the sense plate and the trip module 12 to ensure that the voltage on the reference capacitor will cause operation of the trip module. However, in essence, all that is required is that the sense plate should be coupled to the module 12 and the result must be determined. This results in a powerful noise detection and rejection method.

In a variation of the invention the voltage on the sense plate is checked after it has been charged to the reference voltage $V_{dd}$. If the voltage on the sense plate shows a deviation from $V_{dd}$, the deviation can be attributed to the influence of noise.

In another variation the voltage on the sense plate is checked after the sense plate has been connected to ground. The voltage on the sense plate should then be zero and any deviation from zero is attributable to the effect of noise.

The method of the invention verifies that the sense plate is stable and is not influenced by an unwanted noise source. This is most readily done during periods in which the voltage or charge on the sense plate is at a known level due to the controlling circuit.

In the preceeding general discussion it is mentioned that a variation in the voltage of Cx or Cs is monitored. However, experience has taught that the variation observed can actually result from noise influencing the power levels, reference voltages or the trip level detection circuits and is not necessarily responsive to changes in the actual voltages on Cx, Cs or another capacitor used for noise detection operation. This fact does not influence the usefulness of the proposed scheme since it still gives a valid indication of noise levels.

Figure 4:
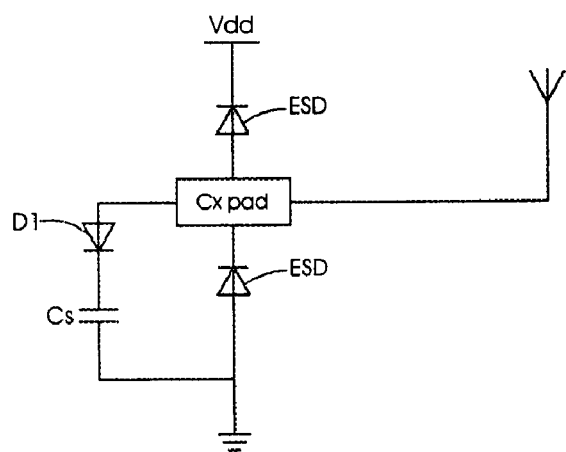
FIG. 4 depicts a circuit to measure cell phone noise which is coupled into a typical capacitor sensing circuit.
Figure 5:
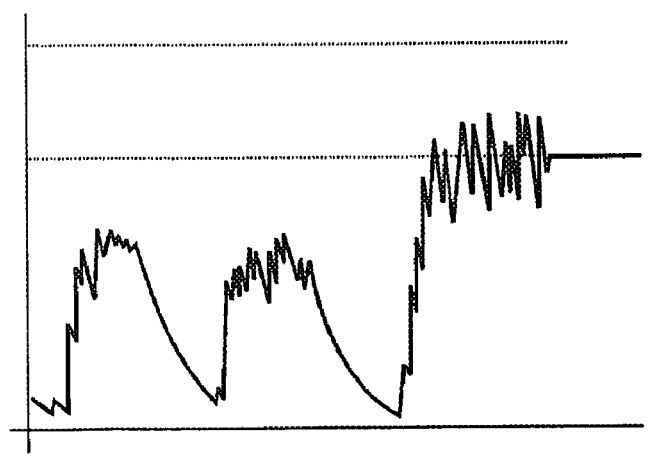
FIG. 5 illustrates the effect of noise generated by a mobile phone which is moved towards and away from a sense plate which is connected to a reference capacitor in a capacitive sensing circuit.

FIG. 4 shows a circuit which is used to measure cell phone noise that will couple into a typical sense pad or plate Cx connected to a sense antenna and reference capacitor Cs structure. FIG. 5 shows the influence of noise as the phone is moved towards and away from the sense plate. The noise level is significant compared to the level of signals which are used in the charge transfer of the invention.

In another embodiment the sense plate and reference capacitor are connected and operated to be defined in a defined voltage range. The voltage of the reference capacitor is checked to be stable or, for example, below a certain level. An advantage of this approach is that the reference capacitor, which has a relatively large capacitance value, and the ESD diodes in the pads (see FIG. 4), form a structure which can be charged and which shows the noise in a low frequency range.

In another embodiment a normal sensing channel can be connected without an antenna for normal capacitive sensing but rather as an antenna for detecting noise (e.g. power supply noise, RF noise, mobile phone noise, electronic signal switching noise). Any influence on measurements due to noise will be reflected in the measurement values. As the noise can be checked in this extra channel at the same time as when other measurements are taking place, it is also possible to accurately identify and eliminate bad values.

An advantage of checking the voltage on the reference capacitor is that the reference capacitor is typically already coupled to a comparator or trip level sensor which can be used, adapted as necessary, to check for the presence of noise. This results in a cost effective sharing and usage of an existing circuit arrangement. Sufficient time should be allowed for the targeted noise to couple into the sense plate and into the rest of the circuit. A decision on how often to perform the noise tests and which of the tests to include is a matter which depends on the specific application or product. The method of the invention can however be employed in conjunction with debounce protocols and other noise rejection strategies to eliminate a specific type of noise signal. The checking of a related measurement on the same basis and for the same phenomena would be covered by the principles of the invention. For example a measurement of a current flowing into or out of the sense plate or the reference capacitor during periods in the charge and discharge cycles in which no coupling is made to these elements would be indicative of the presence of noise.

It is also possible to check the voltage on the sense plate once the trip module has been triggered because a relatively long period of processing time is required before a following charge/discharge cycle commences. A decision which is application-dependent is whether the voltage on Cx is checked for a rising voltage when charge flows into the sense plate from a noise source, or for a dropping voltage when charge flows from the sense plate to a noise source. It may also be advantageous to charge or discharge the sense plate and the reference capacitor to slightly above or slightly below the trip voltage in sequence and determine if the trip module output changes in a time period thereafter. This will address increasing and decreasing effects due to noise.

The method of the invention according to this embodiment, based on checking the voltage on the sense plate or on the reference capacitor, is well suited for acting on a strong noise signal which is present intermittently for, when the noise is present, operation can be in one way and, when noise is not present, operation can be another way.

Figure 6:
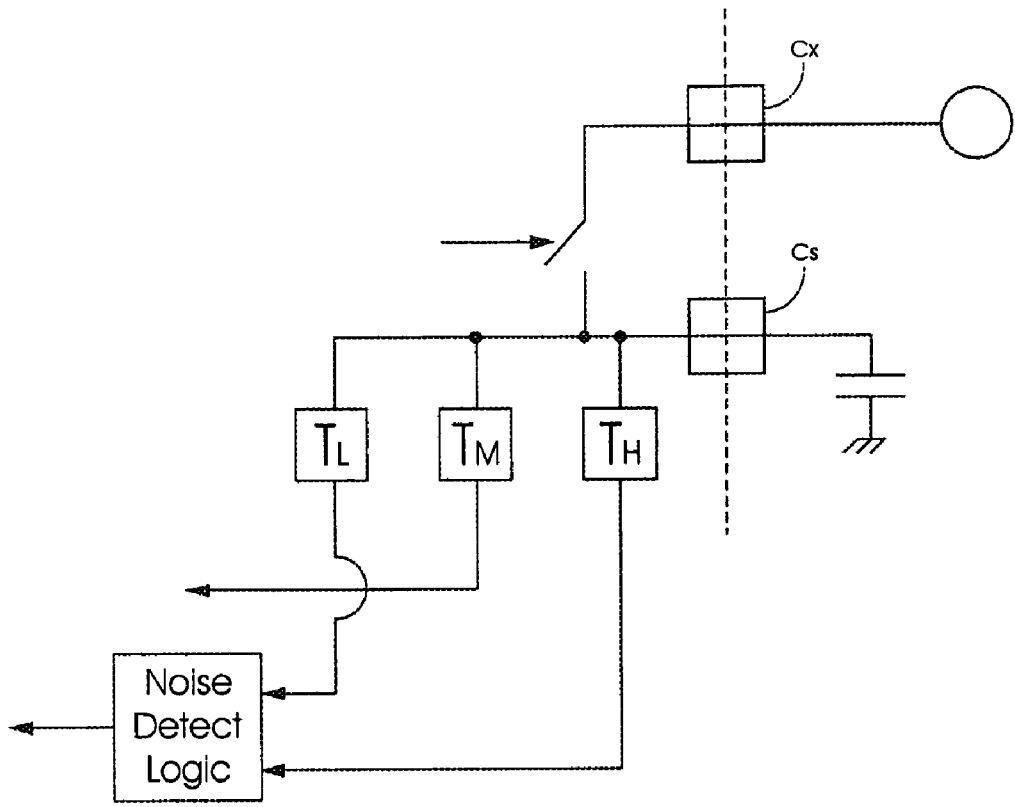
FIGS. 6, 7 and 8 illustrate further variations according to the invention.

FIG. 6 illustrates a configuration in which the noise detection is attached to a reference capacitor (Cs) and $T_L$, $T_M$ and $T_H$ depict low, middle and high trip level detectors with $T_M$ being the normal trip level associated with charge transfer operations.

Figure 7:
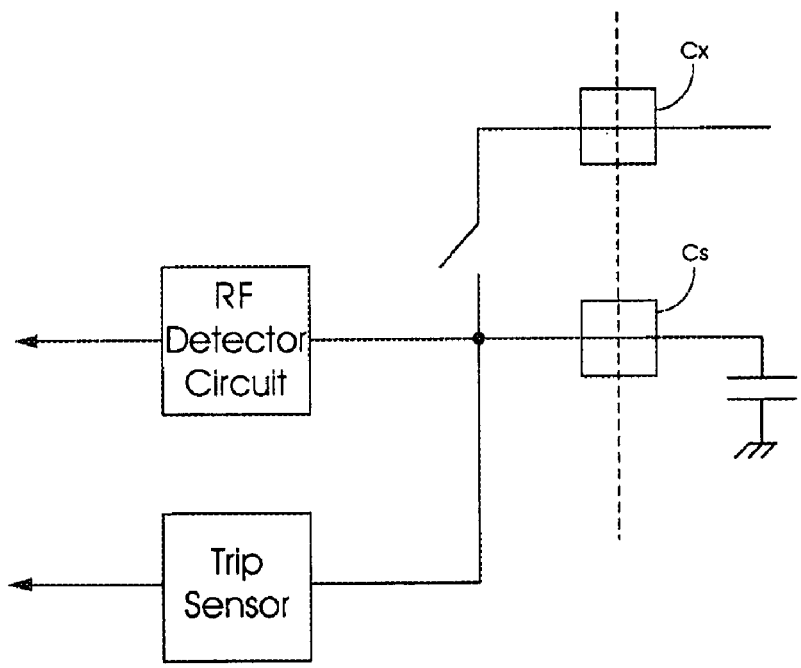

FIG. 7 illustrates a different approach to detecting the noise with a noise detector being connected to Cs.

Figure 8:
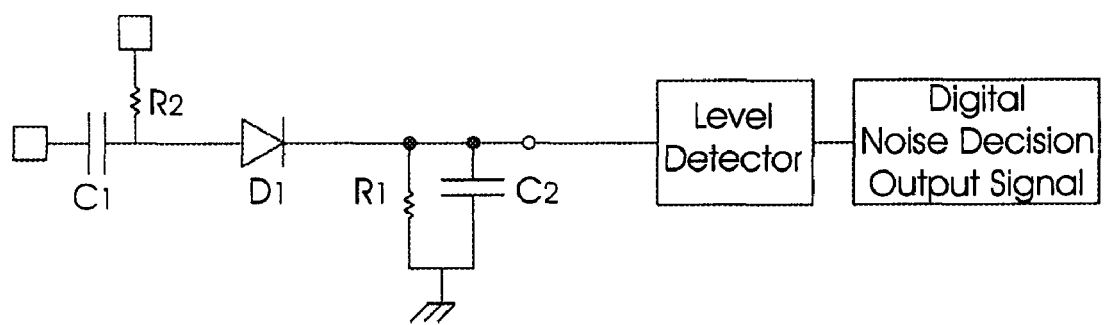

FIG. 8 illustrates an example of a RF noise detector with a non-linear element (diode D1) biased by a current through R2. C1 can be used to filter the noise that will influence the detector and R1, C2 can create a response time or low pass filter effect.

The structures in FIGS. 7 and 8 detect RF noise coupling with the sense structure of a sense circuit in general. The forward biased diode D1 shown in FIG. 8 can be replaced by a different type of structure readily found in the literature. An advantage of this approach is that noise detection can be operational all the time. If the coupling with Cs is done in a way that the normal charge transfer cycle does not interfere with the RF (noise) detector output, then this circuit can be active continuously. The design can be done, for example using C1 to create a high pass filter effect, in order to filter out the charge transfer signals from the detector circuit.

If the detector is not coupled with Cs but rather with the power supply circuit of the complete module, then it may be advantageous to have most signals pass through to the detector, in order to be able to detect all possible noise signals. This may also be applicable when the RF detector is connected to Cs or Cx, but then the output may not be usable when the charge transfer is taking place. i.e. if no applicable filter structure is employed prior to the input of the RF detector, then the RF detector output may only be valid when the charge transfers are not taking place due to the influence the charge transfer operations may have on the RF detector which may then be better designated a noise detector.

It is also possible to identify some structures on silicon which are susceptible to noise coupling via the sense plate and then to design filters to remove or reduce these sources of noise. This approach results in a custom-designed microchip, or ASIC. Nonetheless the methods according to some embodiments of the invention will help in the situation where noise gets past these barriers and corrupts the measurement of the capacitive sensor, and results in corrupt or invalid capacitive sensor readings.

Figure 9:
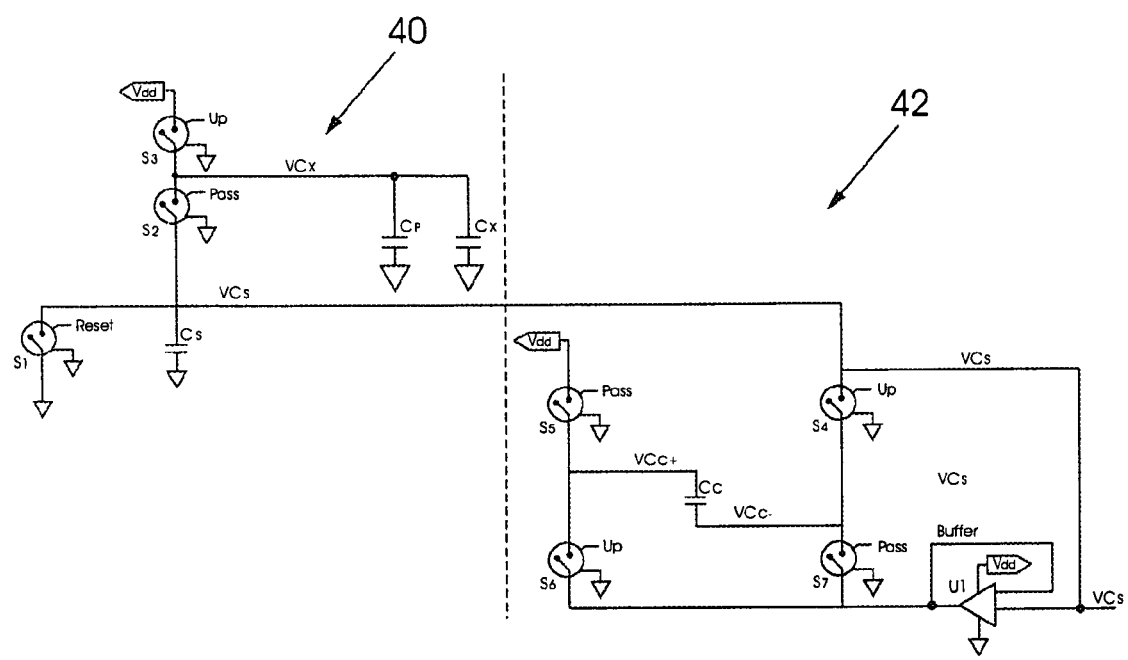
FIG. 9 illustrates a typical charge transfer circuit connected to a capacitance cancellation circuit.

FIG. 9 is a schematic diagram of a circuit for parasitic capacitance cancellation that can be used for sense plate or antenna tuning.

Figure 10:
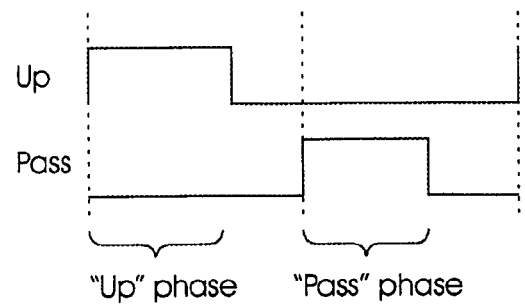
FIG. 10 illustrates two parts of a charge transfer cycle.
Figure 11:
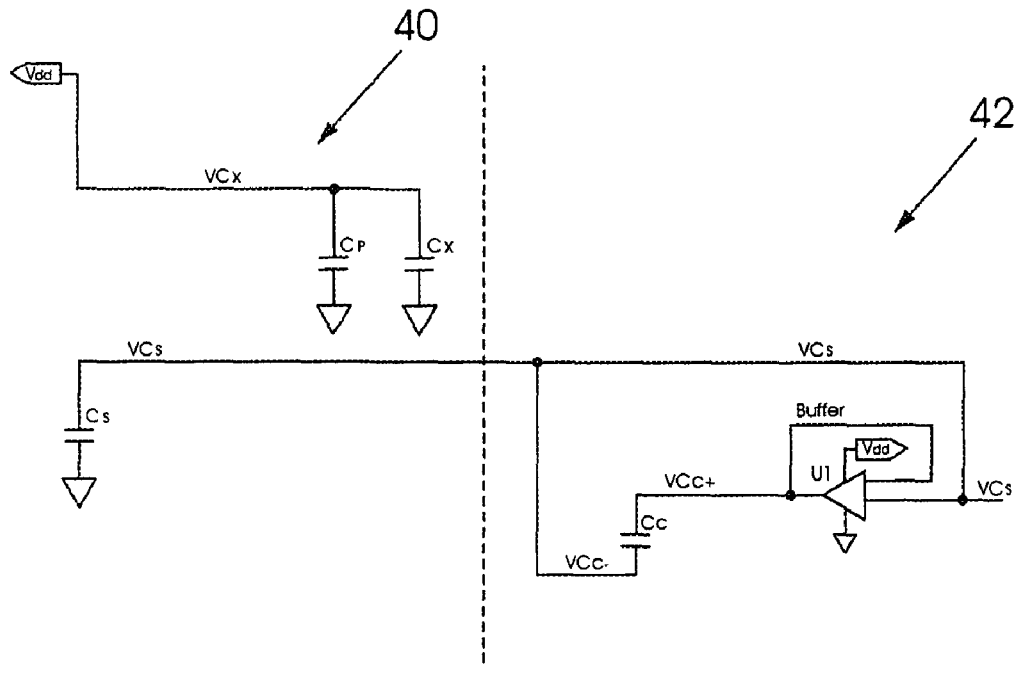
FIG. 11 shows an effective circuit during an "Up" phase.
Figure 12:
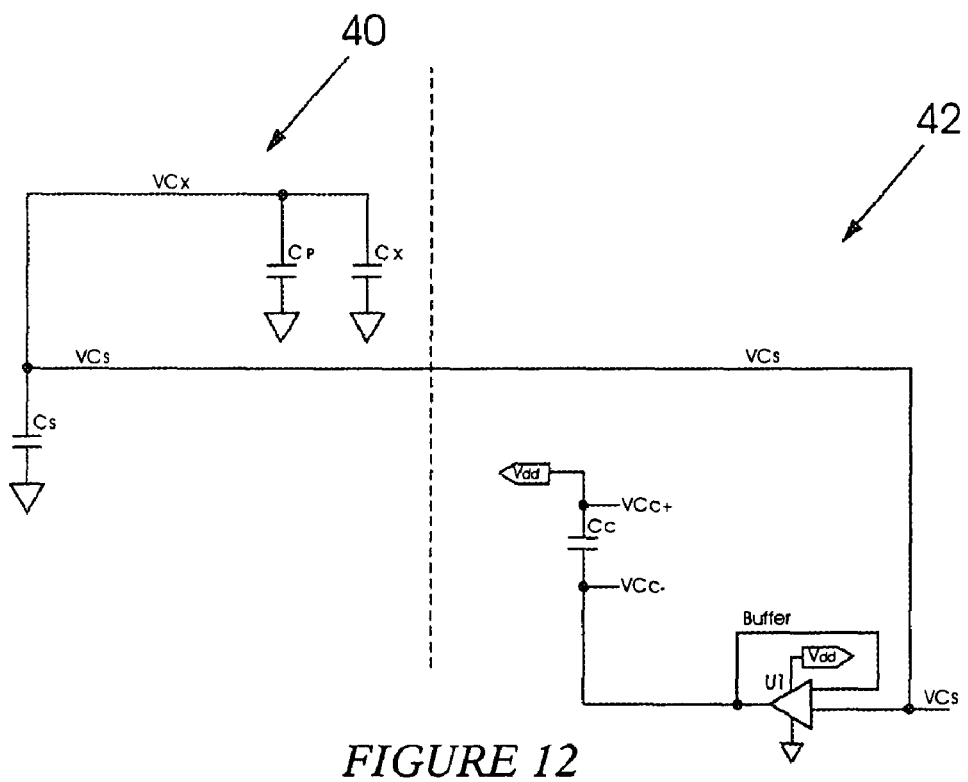
FIG. 12 shows an effective circuit during a "Pass" phase.

In a further inventive step a capacitance cancellation circuit 42 is used to reduce the capacitance of a sense plate that is linked to a charge transfer circuit 40. The charge transfer circuit 40 functions by charging the sense plate Cx and any parasitic capacitance CP to a known constant voltage (VDD) during an "Up" phase (FIGS. 10 and 11). During a "Pass" phase the charge in CX and CP is transferred to a storage capacitor CS (FIG. 12). Thus during each Up/Pass cycle (FIG. 10) the voltage on CS increases.

Ideally $C_X$ should charge $C_S$ and not $C_P$. The effect of the parasitic capacitance $C_P$ is that the sensitivity of the capacitance sensing circuit decreases. With careful circuit design and layout, the parasitic capacitance $C_P$ can be minimised but not eliminated. To decrease the effective parasitic capacitance $C_P$ yet further, a compensation technique is adopted. The technique does not eliminate the parasitic capacitance $C_P$ but removes its effect. One method is to subtract the additional (unwanted) charge that $C_P$ adds to $C_S$, from Cs, during each Up/Pass cycle. Thus the net charge added to $C_S$ is only because of $C_X$.

Charge Subtraction Method

During each Up/Pass cycle, the parasitic capacitance $C_P$ adds a charge of $C_P(V_{DD}\text{-}VC_S)$ to $C_S$. This is also the amount of charge that the compensation technique must remove during each Up/Pass cycle.

During the Pass phase (FIG. 12), the amount of charge placed on the compensation capacitor $C_C$ is: $C_C (V_{DD}\text{-}VC_S)$. This charge is supplied by the buffer and the supply voltage ($V_{DD}$). No charge is added to nor removed from $C_S$.

During the Up phase (FIG. 11) the charge on $C_C$ is decreased to 0. The charge needed to change the charge on $C_C$ from $C_C (V_{DD}\text{-}VC_S)$ to 0, is removed from $C_S$. The $VC_C+$ terminal of $C_C$ is connected to the buffer output and the $VC_C-$ terminal is connected to $VC_S$. This connection configuration causes charge to be removed from $C_S$ as $C_C$ discharges from $(V_{DD}\text{-}VC_S)$ to 0.

Thus, if $C_P=C_C$, the additional charge that the parasitic capacitor $C_P$ adds to $C_S$, is removed by the compensation capacitor $C_C$ in the next Up/Pass cycle and the net gain of charge on $C_S$ is only because of $C_X$.

The invention claimed is:

1. A capacitive sensing circuit comprising:
    a sense plate for reflecting a capacitance to be measured; and
    a capacitance measurement circuit including:
    a charge transfer circuit that, during a charge transfer cycle, introduces a charge on said sense plate which reflects a capacitance associated with said sense plate, said charge being introduced by applying a charging voltage of a fixed value to said sense plate, and transfers an amount of charge from said sense plate to said capacitance measurement circuit, said charge transfer cycle being repeated a number of times to form a complete capacitance measurement cycle; and
    a charge subtracting circuit that effectively reduces the measured capacitance by removing an amount of charge from said capacitance measurement circuit during each charge transfer cycle, wherein, during each charge transfer cycle, the amount of said charge removed from capacitance measurement circuit by the charge subtracting circuit is in a proportion to the amount of said charge transferred from said sense plate to said capacitance measurement circuit, which proportion remains the same for each charge transfer cycle in the complete capacitance measurement cycle, irrespective of an amount of charge accumulated in the measurement circuit throughout the complete capacitance measurement cycle.

2. The capacitive sensing circuit of claim 1 wherein the charge subtraction circuit is employed for tuning the sense plate.

3. The capacitive sensing circuit of claim 1 wherein said capacitance measurement circuit includes a reference capacitor that is employed to accumulate the charge received from said sense plate during each charge transfer cycle and the amount of the charge removed by said subtraction circuit from said measurement circuit is reduced as a voltage of said reference capacitor increases.

4. The capacitive sensing circuit of claim 1 wherein the amount of the charge removed from said measurement circuit is not influenced by a value of capacitance associated with the sense plate.

5. The capacitive sensing circuit of claim 1, further including a separate sense channel that is designed not to be influenced by a user, and wherein said sense channel is used for detection of noise.

6. The capacitive sensing circuit of claim 5 further including means for detecting noise and identifying and eliminating capacitive measurement data gathered at the same time that the noise is detected.

7. The capacitive sensing circuit of claim 1 which includes a noise detector that enables the removal of a specific capacitance measurement value if noise was detected by the noise detector during a specific capacitive measurement cycle during which said measurement value was obtained.

8. The capacitive sensing circuit of claim 1 wherein said capacitance measurement circuit includes a reference capacitor that is employed to accumulate the charge received from said sense plate during each charge transfer cycle; and
    the charge removed by said subtraction circuit from said measurement circuit during each charge transfer cycle is removed from said reference capacitor.

9. The capacitive sensing circuit of claim 8 wherein said subtraction circuit includes a compensation capacitor and is configured such that during each charge transfer cycle, an amount of charge which is equal to the amount of charge to be removed from said reference capacitor is applied to the compensation capacitor; and said subtraction circuit further includes means for discharging said compensation capacitor and thereby causing an amount of charge equal to the charge discharged from said compensation capacitor to be removed from the charge accumulated in said reference capacitor.

10. The capacitive sensing circuit of claim 9 wherein said charge subtraction circuit includes an op-amp circuit that is used to implement the charge removal from the reference capacitor during each charge transfer cycle.

11. A method of sensing capacitance which includes the steps of:
    a) introducing a charge on a sense plate which reflects a capacitance associated with said sense plate, said charge being introduced by applying a charging voltage of a fixed value to said sense plate; and
    b) transferring a first amount of said sense plate charge to a capacitance measurement circuit; wherein steps a) and b) combined define a charge transfer cycle and said charge transfer cycle is repeated a number of times to form a complete capacitance measurement cycle; and
    removing a second amount of charge from the capacitance measurement circuit during each charge transfer cycle, wherein said first amount of charge that is transferred from said sense plate to said capacitance measurement circuit and said second amount of charge that is removed from said capacitance measurement circuit, stay in a proportion to one another that remains the same for all of said charge transfer cycles throughout the complete capacitance measurement cycle.

12. The method of claim 11 wherein said capacitance measurement circuit includes a reference capacitor that is employed to accumulate charge received from said sense plate during each charge transfer cycle and wherein the second amount of the charge removed from said capacitance measurement circuit is reduced as a voltage of said reference capacitor increases during the complete capacitance measurement cycle.

13. The method of claim 12 wherein the amount of said charge transferred from said sense plate to the capacitive measurement circuit is proportional to the value of the charging voltage minus a present value of the voltage of said reference capacitor, and said second amount of charge removed from said capacitance measurement circuit during each charge transfer cycle is inversely proportional to the present value of the voltage of said reference capacitor.

14. The method of claim 11 wherein the second amount of the charge removed from said capacitance measurement circuit is not influenced by a value of capacitance associated with the sense plate.

15. The method of claim 11, further including the steps of detecting noise and in response to detection of noise, identifying and eliminating capacitive measurement data gathered at the same time that the noise is detected.

16. The method of claim 15 wherein capacitive measurement data gathered at the same time that noise is detected is eliminated.

17. The method of claim 11 wherein said capacitance measurement circuit includes a reference capacitor that is employed to accumulate the charge received from said sense plate during each charge transfer step, and the charge removed from said capacitance measurement circuit during each charge transfer cycle is removed from said reference capacitor.

18. The method of claim 17, wherein a compensation capacitor and an op-amp buffer circuit are provided to remove said second amount of charge from said reference capacitor during each charge transfer cycle and wherein, for each charge transfer cycle, said op-amp buffer circuit is configured to carry out the steps of:

applying an amount of charge to said compensation capacitor that is equal to the amount of charge to be removed from the reference capacitor; and discharging said compensation capacitor in such manner that the amount of charge removed from said compensation capacitor during said discharging is also removed from said the charge accumulated in said reference capacitor.

* * * * *